(12) United States Patent
Beer et al.

(10) Patent No.: US 7,863,728 B2
(45) Date of Patent: Jan. 4, 2011

(54) SEMICONDUCTOR MODULE INCLUDING COMPONENTS IN PLASTIC CASING

(75) Inventors: Gottfried Beer, Nittendorf (DE);
Christoph Kienmayer, Unterhaching (DE); Klaus Pressel, Regensburg (DE); Werner Simbuerger, Haar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 11/869,354

(22) Filed: Oct. 9, 2007

(65) Prior Publication Data

US 2008/0105966 A1    May 8, 2008

Related U.S. Application Data

(63) Continuation-in-part of application No. 11/421,684, filed on Jun. 1, 2006, now Pat. No. 7,692,588.

(30) Foreign Application Priority Data

Jun. 1, 2005   (DE) .................. 10 2005 025 150
May 16, 2006  (DE) .................. 10 2006 023 123

(51) Int. Cl.
  *H01L 23/31*   (2006.01)
  *H01L 23/498*  (2006.01)
  *H01L 23/34*   (2006.01)

(52) U.S. Cl. .............. 257/700; 257/687; 257/706; 257/E23.129; 257/E23.063; 257/E23.08

(58) Field of Classification Search .............. 257/687, 257/700, 706, E23.129, E23.063, E23.08
See application file for complete search history.

(56) References Cited

U.S. PATENT DOCUMENTS 5,302,849 A * 4/1994 Cavasin ................... 257/666
5,640,048 A * 6/1997 Selna ...................... 257/738
6,359,341 B1 * 3/2002 Huang et al. .............. 257/778
6,388,623 B1   5/2002 Sakota et al.
6,518,932 B1   2/2003 Matsui et al.
6,809,688 B2  10/2004 Yamada (Continued)

FOREIGN PATENT DOCUMENTS

DE        10336171       8/2003

(Continued)

OTHER PUBLICATIONS

Jones, E.M.T., et al., "Surface Matching of Dielectric Lenses", Journal of Applied Physics, vol. 26, 1955, No. 4, pp. 452-457.

(Continued)

*Primary Examiner*—Victor A Mandala
(74) *Attorney, Agent, or Firm*—Banner & Witcoff, Ltd.

(57) ABSTRACT

A semiconductor module includes components in a plastic casing. The semiconductor module includes a plastic package molding compound and a semiconductor chip. Also provided in the module are a first principal surface including an upper side of the plastic package molding compound and at least one active upper side of the semiconductor chip, a second principal surface including a back side of the plastic package molding compound, and a multilayered conductor track structure disposed on the first principal surface and a second metal layer disposed on the second principal surface.

17 Claims, 15 Drawing Sheets

U.S. PATENT DOCUMENTS

| | | | |
|---|---|---|---|
| 6,885,344 | B2 | 4/2005 | Mohamadi |
| 6,949,405 | B2 | 9/2005 | Hagen |
| 7,239,851 | B2 | 7/2007 | Kosemura et al. |
| 2003/0002271 | A1 | 1/2003 | Nurminen |
| 2004/0067603 | A1 | 4/2004 | Hegen |
| 2005/0057421 | A1 | 3/2005 | Mohamadi |
| 2005/0156789 | A1 | 7/2005 | Mohamadi |
| 2006/0043568 | A1* | 3/2006 | Abe et al. .................. 257/698 |
| 2006/0131734 | A1* | 6/2006 | Kummerl et al. ............ 257/706 |
| 2007/0013051 | A1 | 1/2007 | Heyan et al. |
| 2007/0018308 | A1* | 1/2007 | Schott et al. ................ 257/700 |
| 2007/0026567 | A1 | 2/2007 | Beer et al. |
| 2007/0069353 | A1 | 3/2007 | Beer et al. |
| 2007/0257356 | A1* | 11/2007 | Abe et al. ................... 257/700 |

FOREIGN PATENT DOCUMENTS

| | | |
|---|---|---|
| DE | 10246283 | 3/2004 |
| WO | 0021030 | 4/2000 |
| WO | 2004/114365 A2 | 12/2004 |
| WO | 2005/015632 A1 | 2/2005 |

OTHER PUBLICATIONS

Yuichi, Tanaka, et al.; "A 76-77 GHz High Isolation GaAs PIN-Diode Switch MMIC"; R&D Review of Toyota CRDL; vol. 37, No. 2; pp. 19-26, May 2002.

Gresham, I., et al., "A Compact Manufacturable 76-77-GHz Radar Module for Commercial ACC Applications"; IEEE Transactions on Microwave Theory and Techniques; vol. 49, No. 1; pp. 44-57, Jan. 2001.

Li, R.L., et al., "Integration of Miniaturized Patch Antennas with High Dielectric-Constant Multilayer Packages and Soft-and-Hard Surfaces (SHS)"; IEEE Transactions on Microwave Theory and Techniques; vol. 49, No. 1; 5 pages, Jan. 2001.

Koller, R., et al., "A Single-chip 0.13 µm CMOS UMTS W-CDMA Multi-band Transceiver"; 4 pages, 2005.

* cited by examiner

SEMICONDUCTOR MODULE INCLUDING COMPONENTS IN PLASTIC CASING

RELATED APPLICATIONS

This application is a continuation-in-part application of prior U.S. application Ser. No. 11/421,684, filed Jun. 1, 2006, which application claims priority to German application nos. 10 2006 023 123.6, filed May 16, 2006 and 10 2005 025 150.1, filed Jun. 1, 2005, the disclosures of which are incorporated herein by reference in their entirety.

TECHNICAL FIELD

Aspects of the invention relate to a semiconductor module including components in a plastic casing.

BACKGROUND

Semiconductor devices with plastic housing compositions are in widespread use in semiconductor electronics. On the one hand, the plastic housing composition is intended to protect and hold together the electronic components and, on the other hand, in so far as internal wirings are provided within the semiconductor device, they are intended to be electrically insulated from one another by the plastic housing composition.

SUMMARY

A semiconductor module includes components in a plastic casing. According to an illustrative aspect, a first principal surface includes an upper side of a plastic package molding compound and at least one active upper side of a semiconductor chip and a second principal surface including a back side of the plastic molding compound. According to a further aspect, a multilayered conductor track structure is disposed on the first principal surface and a second metal layer is disposed on the second principal surface.

BRIEF DESCRIPTION OF THE DRAWINGS

Illustrative aspects of the invention will be explained in detail with reference to the appended figures. The figures are only schematic and not to scale; thin-film layers in particular are shown as disproportionately thick for better representation.

DETAILED DESCRIPTION

Figure 1:
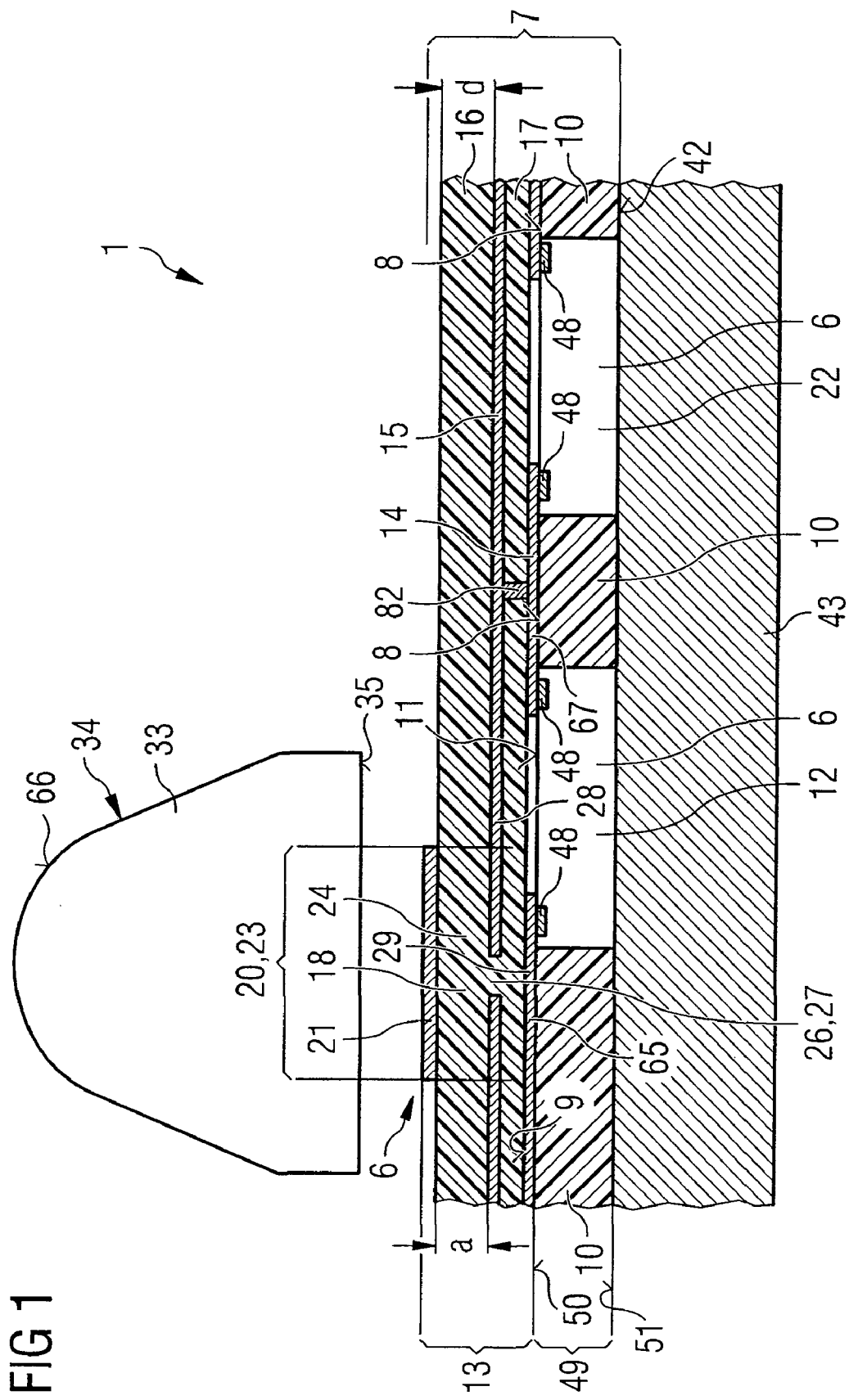
FIG. 1 is a schematic cross section through a semiconductor module of a first illustrative embodiment.

Illustrative aspects of the invention provide a semiconductor module including components for microwave engineering in a plastic casing. For this purpose the semiconductor module has a principal surface including an upper side of a plastic package molding compound and at least one active upper side of a semiconductor chip. Disposed on the principal surface is a multilayered conductor track structure which alternately includes structured metal layers and structured insulation layers. At least one of the insulation layers and/or the plastic package molding compound has at least one microwave insulation region.

This semiconductor module may have the advantage that the plastic casing provides a "quasi"-monolithic block which includes all the components for a semiconductor module for microwave engineering. Providing at least one microwave insulation region, either in the insulation layers provided on the plastic casing or inside the plastic package molding compound of the plastic casing, can have the advantage that not only the semiconductor chips required for the function of the semiconductor module can be embedded in the quasimonolithic block of a plastic casing but also an antenna structure is an integral component of the plastic casing.

In addition, it can be beneficial that the entire plastic package molding compound or a complete insulation layer does not include a material suitable for microwave engineering but it is entirely possible to provide at least one microwave insulation region in the insulation layers and/or in the plastic package molding compound of the plastic casing.

For this purpose, the microwave insulation region may have a relative dielectric constant $\in_r$ between $1 \leq \in_r \leq 2.5$. Plastic foams having a relatively low specific weight can also be used to implement this type of microwave insulation region. These foam materials have typical pore sizes of 0.4 mm. If the microwave insulation region is miniaturized further, however, material properties which are no longer homogeneous can be obtained for these types of foam materials, which means that the $\in_r$ tolerances become impermissibly large.

It is indeed possible to freely mill a relevant microwave insulation region in printed circuit boards as carriers of a microwave module so that an $\in_r$ of approximately 1 is constructively feasible. Here though, the milling technique has dimensional limits below which it is not easy to go so that limits are consequently also imposed on the miniaturization. In addition, it can be difficult to produce blind holes which end at a metal layer by milling. Furthermore, while milling does allow the fabrication of blind holes, this may be cost-intensive and the costs increase with smaller dimensions.

A further possibility for creating through holes and therefore microwave insulation regions with $\in_r\sim 1$ is to use a laser removal method but this also can be expensive. In addition, none of these methods allows any kind of undercuts which are possibly advantageous especially for a patch antenna structure with apertures.

These limitations are surmounted for the first time by the solution so that antenna structures can also be implemented as an integral component of a semiconductor module with components for microwave engineering in a plastic casing. In addition, the use of a casing may have the advantage that a principal surface including a semiconductor chip surface and plastic package molding compound surface is available, which provides flat surfaces having relatively low topography for subsequent thin-film processing of conductor track connections to electrodes of semiconductor chips and for the provision of slotted electrodes, striplines, and radiation plates of patch antenna structures in different metal layers.

In an illustrative embodiment, the semiconductor module can have a microwave insulation region for a patch antenna structure or a strip antenna structure or a slotted antenna structure with correspondingly matched radiation plate.

In one aspect an antenna structure which operates with an antenna coupling region in the insulation layer and/or the plastic package molding compound and advantageously has no ohmic contact between an energy-supplying stripline and a spatially radiating antenna plate.

In an illustrative embodiment, a coupling cavity may be provided in the plastic package molding compound or in an insulation layer as the microwave insulation region. In a coupling cavity a relative dielectric constant $\in_r$ with $\in_r\sim 1$ is automatically provided. For this purpose, the antenna coupling region is covered by the radiation plate. An aperture or a coupling slot for coupling-in the microwave energy is provided opposite to the radiation plate. In one aspect, the aperture can be formed by a slotted electrode. This slot of a slotted electrode is intersected by a spaced stripline for a polarized antenna coupling of a polarized patch antenna structure, at a distance from the slotted electrode.

In a further illustrative embodiment, the aperture is formed by a double-slotted electrode having coupling slots arranged orthogonally to one another with each being intersected at a distance by spaced striplines for a dual-polarized antenna coupling of a dual-polarized aperture-coupled patch antenna structure.

It is further provided that the semiconductor module includes a dielectric lens which is disposed above the radiation plate. This can have the advantage that the directionality of the antenna structure can be further improved and the coupling to space is more effective.

In one aspect, the spacing between the aperture and radiation plate corresponds to the thickness of the insulation layer in the microwave insulation region. This type of construction has the advantage that one of the upper insulation layers on the plastic casing having a relative dielectric constant in the range of $1\leq\in_r\leq 3.5$ can be used as standard throughout for the antenna coupling region. In addition to the coupling of the radiation plate, this insulation layer can additionally be used as a pure insulation layer between two structured metal layers.

In a further illustrative embodiment, it is provided that the spacing between aperture and radiation plate corresponds to the thickness of a plastic package molding compound of a plastic casing and is disposed as a coupling cavity in the plastic package molding compound and is matched to different coupling frequencies of the antenna structure. This has the advantage that the height of the coupling cavity can be defined at the same time as the thickness of a plastic casing and by varying the thickness of the plastic casing, matching to different coupling frequencies of the antenna structure can be achieved by constructive measures without any problems.

In addition to producing different plastic casing thicknesses of a plastic casing, matching of the antenna structure to different coupling frequencies can be provided by special constructive measures in the area of the antenna structure, different from the thickness of the plastic casing. For this purpose, the spacing between aperture and radiation plate can be matched to different coupling frequencies of the antenna structure by arranging the aperture on different metal layers of the multilayered conductor track structure on the principal surface. In this case, the possibility of using the different levels of the metal layers on the principal surface is used to match to different coupling frequencies.

A further possibility for matching the different coupling frequencies of the antenna structure consists in matching the spacing between aperture and radiation plate to the coupling frequency of the antenna structure by different shaping of a base surface of a dielectric lens. For this purpose, the base surface of the dielectric lens can be constructed as a mesa structure where the mesa structure bears the radiation plate. In addition, it is possible that the base surface of the dielectric lens has an indentation in which the radiation plate is disposed. In the case of the mesa structure, a higher coupling frequency can be achieved and in the case of the indentation in the dielectric lens, a reduced coupling frequency will result.

In addition, it is easily possible to dispose a VCO for extremely high frequencies in the plastic package molding compound. The VCO may be disposed adjacent to the microwave insulation region with the antenna structure. With this construction the strip line from one electrode of the VCO semiconductor chip to an aperture of a slotted electrode arranged at a distance can be executed in a manner such that signal reflections and the coupling-in of electromagnetic interference fields are minimized. In no hitherto-known technology is it possible to produce such an optimally matched connection between a VCO semiconductor chip and a patch antenna structure.

Furthermore, other semiconductor chips such as a DSP (digital signal processor) semiconductor chip for microwave components can be embedded in the plastic package molding compound so that these semiconductor chips are arranged adjacent to the microwave insulation region with antenna structure.

The semiconductor module can have not only individual antennas but antenna structures with antenna arrays which are arranged in a microwave insulation region. These antenna structures can be arranged in a square or in a rectangle, respectively one antenna structure being arranged in one corner of the square or the rectangle. These antenna arrays can also be arranged in an edge zone of a semiconductor module in a line or in rows. These antenna arrays do not have external contacts but are connected to the semiconductor chip by direct leads on the principal surface of the plastic casing. Consequently, regions of the semiconductor module are obtained which cannot be supported on electrically conducting external contacts such as solder balls so that these regions are arranged almost suspended on a superordinate circuit board. In order to stabilize and support these regions in an advantageous manner, the semiconductor module can have surface-mountable solder balls which are partly provided as mechanical supports and/or spacers of the semiconductor module for surface mounting on a superordinate circuit board.

In a further illustrative embodiment, heat sinks are provided on a side of the semiconductor module opposite to the external contacts or the solder balls for support functions. These heat sinks can be connected to the back side of the plastic casing by a heat-conducting adhesive layer or solder layer so that they are firmly bonded. In addition, the heat sink can have cooling fins which intensively radiate the heat to the surroundings and/or can deliver it by convection. In an illustrative embodiment, the cooling fins of the heat sink are arranged such that the semiconductor module is fixed on the heat sink between the cooling fins. In addition, the cooling fins between which the semiconductor module is arranged can themselves have solder balls which are used for the mechanical fixing on a superordinate circuit board.

A screening case can also be used as heat sink, the semiconductor module being fixed on an inner side of the screening case. Solder balls arranged on the cooling fins of the heat sink or solder paste on the side wall ends of the side walls of a screening case can form a plane with the external contacts of the semiconductor module, wherein the external contacts and the solder balls of the heat sink or the solder paste of the screening case are surface-mounted. Furthermore, the heat sink and a patch antenna structure can be arranged on the back side of the semiconductor module. This has the advantage that the heat sink surrounding the patch antenna structure can at the same time function as a groundplane and thus improves the directional characteristic of the patch antenna.

If a semiconductor module of this type is used in a distance detection radar for vehicles, it can be advantageous if this distance detection radar has antenna structures arranged at least in one line. Semiconductor modules whose antenna arrays are arranged on a square or rectangular surface and occupy at least the corners of this square or rectangular surface with respectively one antenna structure, are used as navigation equipment with satellite-assisted global position detection. Transponders can also be fitted with a semiconductor module of this type to allow a global position enquiry of a device or vehicle using a semiconductor module.

Two methods can be used for fabricating a semiconductor module with components for microwave engineering in a plastic casing. One method can be used to build or produce antenna structures with a cavity resonator of a plastic package molding compound as an integral component of a plastic casing and another method yields a semiconductor module with an antenna structure, the antenna structure being provided in an insulation layer having a relative dielectric constant $\in_r$ between $1 \leq \in_r \leq 3.5$ of a plastic casing.

In the method for fabricating a semiconductor module with components for microwave engineering in a plastic casing, where the plastic casing has a resonator cavity for an antenna structure, the following process steps can be carried out successively.

Firstly, components of the semiconductor module including at least one semiconductor chip for extremely high frequencies with electrodes on an active upper side and/or including passive components with corresponding electrodes on a connecting plane are fabricated. In preparation for the coupling cavity of the antenna structure, at least one sacrificial material structure for a microwave insulation region of the semiconductor module is produced. After this fabrication of single components, the semiconductor chip, the passive components with their electrodes, and the sacrificial material structure are applied to an upper side of a subcarrier. The sacrificial material structure is then inserted at relevant points similar to the placement of semiconductor chips on the subcarrier. The components are then embedded or laminated in a plastic package molding compound on the subcarrier.

The subcarrier can then be removed so as to expose a principal surface including plastic package molding compound, electrodes, and an upper side of the sacrificial material structure and so as to form a composite board. A multilayered conductor track structure is applied to the principal surface on this composite board by applying structured insulation layers alternately with structured metal layers. Finally the sacrificial material structure is removed from the back side of the composite board. The cavity thereby produced can then be configured to form a microwave insulation region.

This method can have the advantage that a considerable cost saving can be made by producing semiconductor modules in parallel on one subcarrier. The method also can have the advantage that as a result of a simple layout, it can be ensured that the sacrificial material structure is not coated with thin film over a small area, for example, of less than 100 $\mu m^2$ and consequently is subsequently freely accessible for suitable chemicals for dissolving the sacrificial material structure. It is furthermore possible that the back side of the semiconductor module can be processed completely independently of the upper side of the semiconductor module. The sacrificial material structure is then removed by suitable solvents or etching agents. A defined resonance cavity having the desired $\in_r=1$ for air is left behind.

It is not actually necessary to close the access opening but the cavity can be filled with a suitable liquid having a predetermined $\in_r$ and then closed. This liquid whose relative dielectric constant $\in_r$ is between $1 \leq \in_r \leq 3.5$, produces a liquid-filled cavity. This liquid-filled cavity initially has an opening toward the back side of the semiconductor module which, however, can be terminated by a corresponding dielectric lens structure in a completely liquid-tight manner. The cavity thereby produced can thus be configured as a microwave insulation space of a patch antenna structure, a strip antenna structure, and/or a slotted antenna structure with radiation plate.

The material properties of the sacrificial material are on the one hand a temperature resistance as far as at least the curing temperature of the plastic package molding compound and the dielectric. Furthermore, the sacrificial material should be resistant and chemically inert to the plastic package molding compound, the dielectric, and the process chemicals of the thin-film technology, as well as the chemicals for developing a photoresist, for corresponding electrolytes, and for stripping chemicals. Finally, the sacrificial material should be chemically soluble/etchable in solution/etching which does not attack, or attacks to a sufficiently small degree the thin-film layers such as the dielectric and metal layers and the plastic package molding compound. The surrounding compound can be predetermined by the plastic package molding compound so that the cavity produced is configured to form a resonance cavity for extremely high frequencies in the plastic package molding compound of the plastic casing.

The cavity thereby produced can be covered by a radiation plate and an aperture or a slot for coupling in the microwave energy can be disposed opposite to the radiation plate. A polarized and aperture-coupled patch antenna structure can be implemented with a cavity thus configured. If the cavity in a plastic package molding compound is closed by the radiation plate, the height of the cavity corresponds to the thickness of the composite board, the composite board defining the coupling frequency. The position of the radiation plate can be varied by configuring a lens which terminates the cavity in the plastic casing so that the spacing between aperture and radiation plate can be matched to different coupling frequencies.

The sacrificial material structure can be formed from polyamide, which advantageously facilitates the removal of the sacrificial material structure from the plastic package molding compound using a solvent. Polyamide is sufficiently thermally stable and can be dissolved both in acetone and in butyrolactone whereas typically curable dielectrics such as polyimide, BCB, PBO, and all other metals contained in the multilayered conductor track structure are resistant to acetone and butyrolactone.

A first dielectric can also completely cover and thereby protect the sacrificial material. This now allows greater degrees of freedom in the choice of sacrificial material since the condition that the sacrificial material must be resistant to all thin-film process chemicals is eliminated. However, before the sacrificial material can be dissolved with suitable chemicals, before removing the sacrificial material structure, the plastic package molding compound or the protective layer is at least partly removed from the back side of the sacrificial material structure, by, for example, laser ablation. An opening in the dielectric is thereby made through which the means for removing the sacrificial material can dissolve out or etch out the sacrificial material structure. In the simplest case, the sacrificial material structure has a glucose-based or salt-based water-soluble sacrificial material so that water can be used as solvent.

Before removing the subcarrier, the composite board or a laminate of semiconductor chips and plastic package molding compound is thinned to such an extent from the back side that the thickness is matched to the different coupling frequencies of an antenna structure. By differently configuring the thickness of a plastic package molding compound of a plastic casing, it is possible to also provide different antenna structures for different frequencies.

A method for fabricating a semiconductor module with components for microwave engineering in a plastic package molding compound where a microwave insulation region is provided in one of the insulation layers instead of a cavity structure, includes the following process steps. Firstly, as in the above method, components of a semiconductor module including at least one semiconductor chip for extremely high frequencies with electrodes on an active upper side and/or including passive components with electrodes on a connecting plane are fabricated. The semiconductor chips and the passive components with their electrodes are then applied to an upper side of a subcarrier. The components are then embedded or laminated in a plastic package molding compound. The preparation and embedding of a sacrificial material structure can be omitted in this method.

The subcarrier can then be removed so as to expose a principal surface including plastic package molding compound and electrodes of the semiconductor chip and/or the passive components so as to form a composite board. A multilayered conductor track structure is applied to the principal surface or the upper side of the composite board by application of structured insulation layers and structured metal layers alternately to the upper side of the composite board. In this case, at least one of the insulation layers is made of a dielectric material for microwave components.

This means that this insulation layer has a microwave insulation region with a relative dielectric constant $\in_r$ between $1 \leq \in_r \leq 3.5$ continuously or at least in parts. Finally, an upper metal layer is structured to form a radiation plate of a patch antenna structure.

Since an insulation layer having a suitable dielectric constant is provided from the outset in this method, it is possible to form a slotted electrode in a deeper metal layer opposite to the radiation plate, which forms an aperture whose slot is intersected by a spaced stripline for a polarized aperture coupling of a polarized and aperture-coupled patch antenna in a metal layer located further thereunder. Consequently, at least three structured metal layers are provided on the principal surface or the upper side of the composite body, the lowermost metal layer having the stripline from one electrode of a semiconductor chip to the patch antenna structure. A middle metal layer forms the aperture or the slotted electrode in the area of the patch antenna. An uppermost metal layer with interposed insulation layer having a suitable relative dielectric constant exhibits the structure of the radiation plate. A radiation plate of this type can be constructed as square but also circular or polygonal.

The spacing between the aperture and radiation plate can be matched to different coupling frequencies of the antenna coupling region by arranging the aperture on different metal layers of the multilayered conductor track structure on the principal surface. This spacing can be adjusted by the thickness of the insulation layer provided there.

In a further embodiment of the method, the radiation plate is arranged on a base surface of a dielectric lens, wherein the spacing between aperture and radiation plate is matched to the coupling frequency of the antenna coupling region by different shaping of the base surface of the dielectric lens.

The same procedure as in the first process example is adopted for the production of the plastic casing, whereby semiconductor chips such as a VCO and/or DSP semiconductor chip for extremely high frequencies are embedded in a plastic package molding compound, these semiconductor chips being arranged adjacent to the microwave insulation region with antenna structure.

In addition, both in the first process example and in the present process example, antenna arrays are provided in the microwave insulation region and antenna structures are arranged in a square or in a rectangle, at least one antenna structure being arranged in the respective corners of the square or the rectangle. It is also possible to arrange an antenna array in the microwave insulation region in the plastic package molding compound of the semiconductor module, where antenna structures are arranged in an edge zone of the semiconductor module in a line. For both illustrative embodiments of the method for producing a semiconductor module, surface-mountable solder balls can be provided partly as external contacts and partly as mechanical supports and/or spacers and soldered on to the semiconductor module. It is also possible, relatively independently of the two methods, to apply heat sinks whose cooling fins extend over the edge sides of the semiconductor module and are fixed to a superordinate printed circuit board for better stabilization of the component. This fixing can be effected by solder balls being applied to the fins, equally the fixing can be carried out by adhesion. Furthermore, the semiconductor module can be mounted on an inner side of a screening case, where a suitable thermally conducting plastic or solder is used for flush mounting or bonding to the inner side. The heat sink together with a patch antenna structure can then be disposed on the back side of the semiconductor module.

Before components are applied, the upper side of the subcarrier is laminated with an adhesive film to prepare the subcarrier for receiving components of the semiconductor module, which has the advantage that large-area subcarriers can be prepared, which are then split into subcarriers for a limited number of semiconductor modules. According to an illustrative embodiment of the method, during fabrication of the multilayered conductor track structure, passive thin-film elements are disposed between the insulation layers before and/or during application of the metal layers. These thin-film elements can be used for matching the semiconductor module to superordinate circuits and/or replace discrete, passive components provided in these semiconductor modules.

The embedding of the components in a plastic package molding compound can be carried out using a compression molding method and/or a dispensing method and/or a laminating method. In order to laminate the components into a plastic package molding compound, a corresponding plastic laminate is heated and laminated onto the subcarrier loaded with components.

FIG. 1 shows a schematic cross section through a semiconductor module 1 of a first illustrative embodiment. The semiconductor module 1 is constructed on the basis of a plastic casing 7 and in this illustrative embodiment, has a large-area metal heat sink 43 on its back side 42, which at the same time can form a groundplane for an antenna structure 34 to increase the directionality of the antenna structure 34.

The plastic casing 7 can have the advantage that the components 6 for microwave engineering can be arranged close to one another and in particular, a connecting lead 65 between an electrode of a VCO semiconductor chip 12 shown here and the antenna structure 34 can be executed as extremely short or as a planar optimized waveguide so that parasitic effects and reflections may be minimized. A signal amplifier and/or a frequency multiplier with external clock signal supply can also be provided as the semiconductor chip 12.

A further advantage that may be realized with the first illustrative embodiment is that an almost flat conductor track structure 13 in thin-film technology not described in detail here can be arranged on a principal surface 8 of the plastic casing 7, which is adapted to the needs of a microwave antenna structure 34. Thus, transmission lines 67 can be implemented directly on the principal surface 8 or on a thin insulation layer applied thereon, especially as these principal surfaces 8 are formed from an upper side 9 of a plastic package molding compound 10 and from upper sides 11 of the semiconductor chips 12 and 22 embedded in the plastic package molding compound 10. Disposed on this first lower metal layer 14 with the corresponding transmission lines 67 between electrodes 48 of the semiconductor chips 12 and 22 among one another and with the antenna structure 34 is an insulation layer 17 which electrically insulates a second metal layer 15 from the first metal layer 14.

A radiation plate 21 of a patch antenna 20 is structured on an upper metal layer. This upper metal layer with the radiation plate 21 has a spacing from the middle metal layer 15. The interposed insulation layer includes an insulation material suitable for microwave engineering where the relative dielectric constant $\in_r$ for this insulation layer 16 is between $1 \leq \in_r \leq 3.5$. The thickness d of this insulation layer corresponds to the spacing a between the radiation plate 21 and a slotted electrode 28 with a coupling slot 27 in the metal layer 15. This coupling slot 27 forms an aperture 26 through which the microwave energy from the connecting lead 65 is coupled into the intermediate space between the radiation plate 21 and the slotted electrode 28. In this first illustrative embodiment, a dielectric lens 33 is arranged above the radiation plate 21, whose base surface 35 is arranged parallel to the radiation plate 21 and whose contour 66 is used to improve the directionality of the antenna structure 34. In a variant not shown the radiation plate 21 is integrated into the dielectric lens 33 by analogy with the following descriptions of FIGS. 8 and 10.

These semiconductor modules 1 can be fabricated at the same time on the basis of a composite board 49, also called a panel, including plastic package molding compound 10 and semiconductor chips 12 and 22. For this purpose, for semiconductor modules 1, a multilayered conductor track structure 13 with transmission leads 67 in a first metal layer 14 on a structured insulating layer optionally applied to the surface 8, is applied to the principal surface 8 formed by the upper side 50 of the composite board 49. Furthermore, a second metal layer 15 is provided for applying a slotted electrode 28. The radiation plate 21 is disposed in a third metal layer and insulation layers 16 and 17 are applied between the metal layers. Furthermore, it is possible to use the second and/or third metal layer outside the antenna region for connecting leads of the individual components or matching structures. The cooling plate 43 shown in FIG. 1 can be attached to the back side 51 of the composite board 49, which forms the back side 42 of the plastic casing, for the semiconductor modules 1. The dielectric lens 33 can also be bonded with its base surface 35 to the radiation plate 21 before the composite board 49 is separated into individual semiconductor modules 1.

Figure 2:
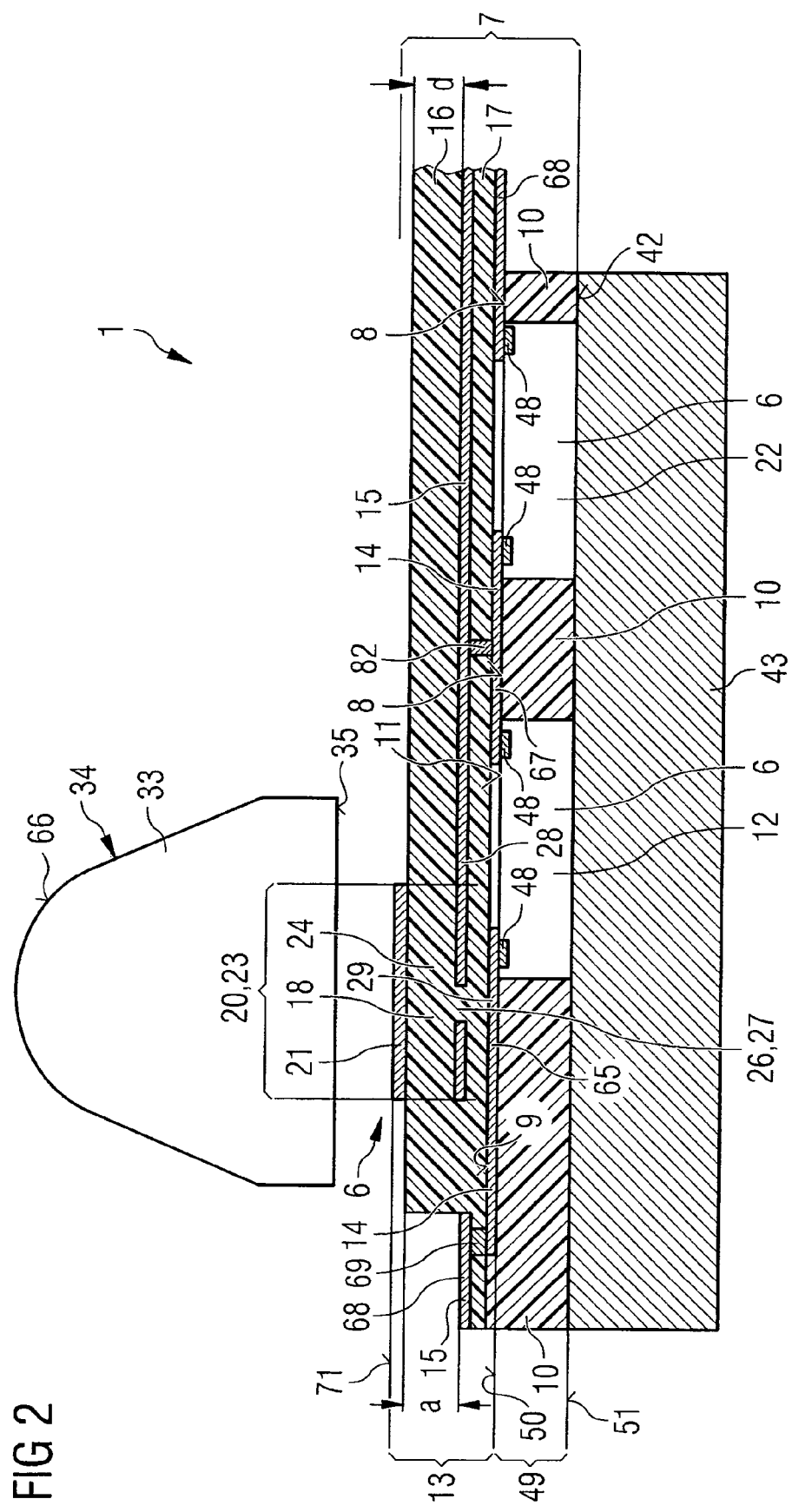
FIG. 2 is a schematic cross section through the semiconductor module according to FIG. 1, with possibilities for application of connecting elements.

FIG. 2 shows a schematic cross section through the semiconductor module 1 according to FIG. 1 with possibilities for attaching connecting elements. Components having the same functions as in FIG. 1 are characterized by the same reference numerals and are not additionally explained. As shown in this illustrative embodiment on the left-hand side in FIG. 2, the insulation layer 16 can be partially or selectively removed down to the structured metal layer 15 to create a contact connecting surface 68 for a connecting element, where a connection to the lower metal layer 14 can be created by a contact via 69. It is further possible to design not only the metal layer 15 but additional metal layers for external contacts, but these are not shown separately here for reasons of clarity.

A further variant for external contacts is shown on the right-hand side in FIG. 2, independent of the left-hand side. The multilayered conductor track structure 13 projects over the principal surface 8 so that a contact connecting surface 68, for example, for a solder ball contact is provided which is then connected to the structured metal layer 14 as shown here. Further metal layers can be used for contact connecting surfaces in exactly the same way, which is not shown here. The overhang of the conductor track structure can easily be produced using a sacrificial layer similar to the coupling cavity, as described previously.

Figure 3:
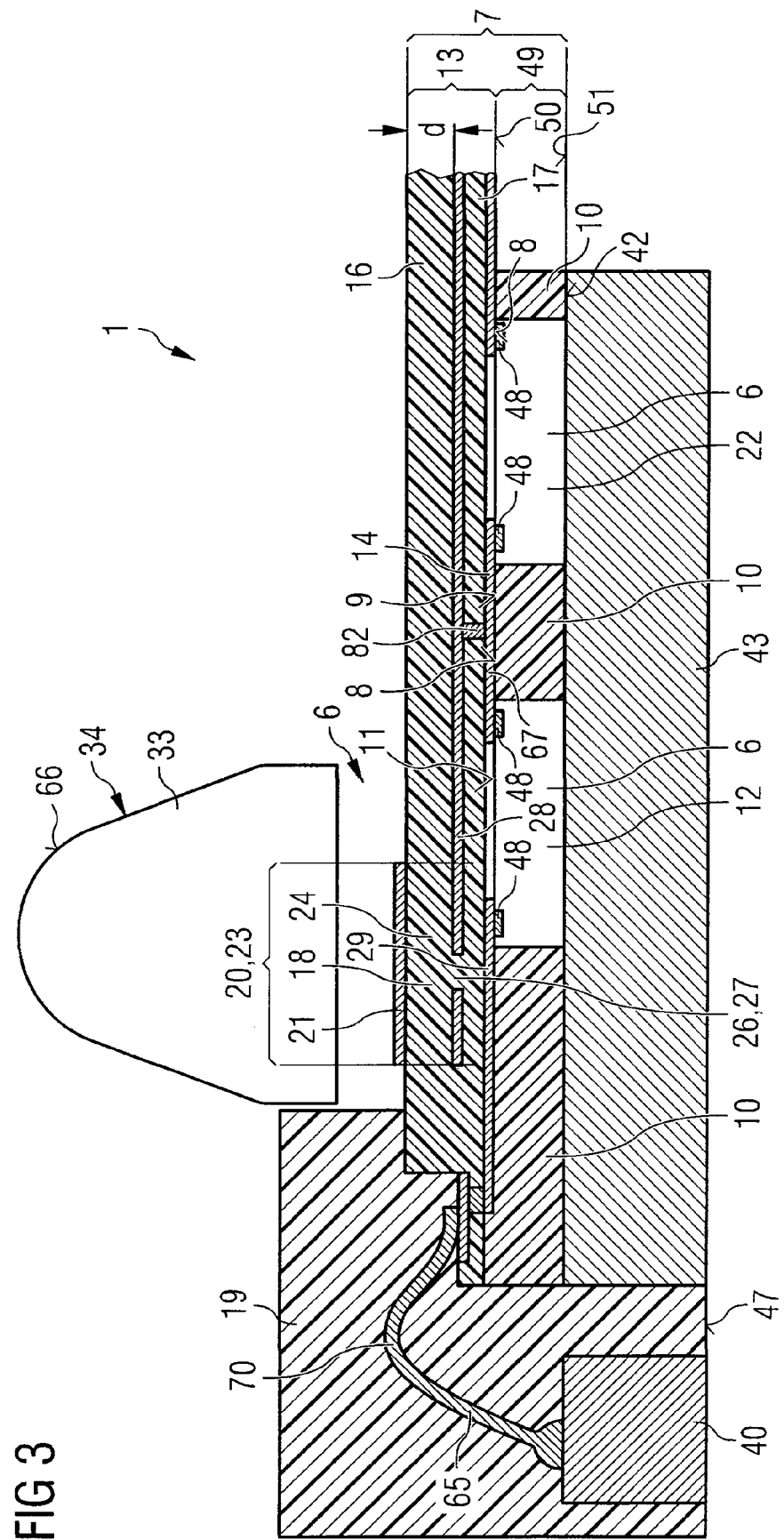
FIG. 3 is a schematic cross section through the semiconductor module according to FIG. 1 with a connecting element to a surface-mountable external contact on the lower side of the semiconductor module.

FIG. 3 shows a schematic cross section through the semiconductor module 1, according to FIG. 1, with a connecting element 65 connecting to a surface-mountable external contact 40, which together with a bond wire 70 is embedded in an additional second plastic package molding compound 19. All other components which have the same function as in FIGS. 1 and 2 are characterized by the same reference numerals and are not additionally explained.

Figure 4:
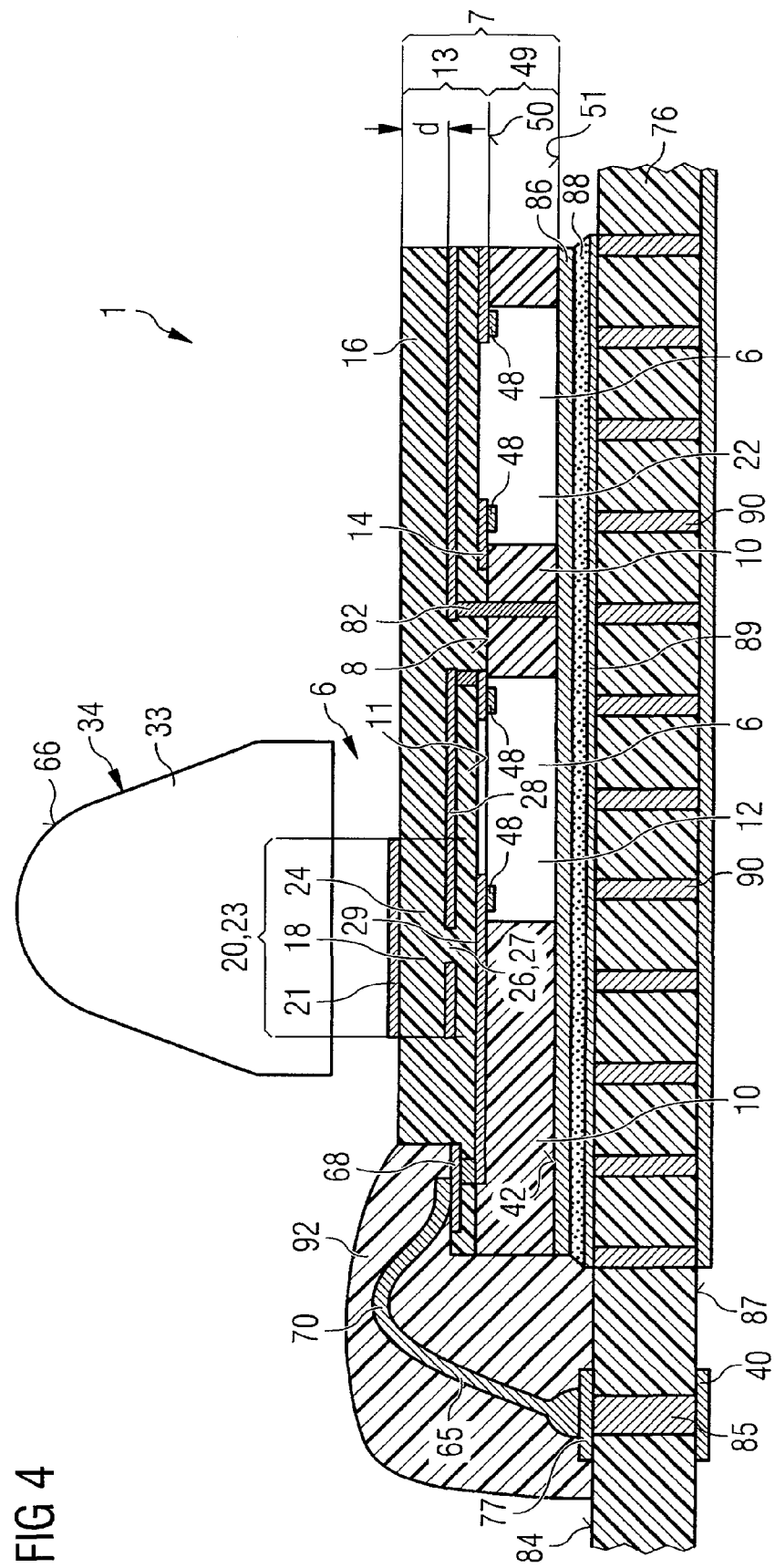
FIG. 4 is a schematic cross section through the semiconductor module according to FIG. 1 with a bond wire connecting element to a contact connecting surface of a superordinate printed circuit board.

FIG. 4 shows a schematic cross section through the semiconductor module according to FIG. 1 which, by analogy with a COB assembly (chip on board) on a superordinate printed circuit board 76, is connected to bond wire connecting elements 70 which are protected with a globtop cover 92, as shown here. For this purpose, the printed circuit board 76 has a connecting contact surface 77 on its upper side 84, which, as shown here, is electrically connected to a flat external contact 40 on the underside 87 of the printed circuit board 76 by a contact via 85 through the printed circuit board 76. Here, as in FIG. 3, the middle metal layer 15 is used to electrically couple the semiconductor module 1 to a connecting contact surface 77 of a superordinate printed circuit board 76.

In addition, in this illustrative embodiment, the semiconductor module 1 has a further metal layer 86 on its back side, which can be structured or can cover the entire back side 42 of the plastic casing of the semiconductor module 1. In this illustrative embodiment in accordance with FIG. 4, this is at least thermally connected to a large-area contact layer 89 on the upper side 84 of the superordinate printed circuit board 76 by a thermally conducting adhesive layer 88 or solder layer so that heat can be delivered by contact vias 90 to a cooling surface 91 disposed on the underside 87 of the printed circuit board 76, which for its part is in operative connection with a heat sink not shown. However, the contact vias 90 can also be used as electrical contact vias provided that a conducting adhesive is used as adhesive layer 88. In addition, the metal layer 86 can be configured so that instead of the large-area contact layer 89, individual connecting contact surfaces on the upper side 84 of the printed circuit board 76 can be connected to correspondingly structured contacts on the back side 42 of the plastic casing 7. In addition, the illustrative embodiment shown here in accordance with FIG. 4 has one or more contact vias 82 which connect the metal layer 86 on the back side 42 of the plastic casing 7, for example, to the middle metal layer 15 within the multilayered conductor track structure 13. Consequently, the semiconductor module 1 opens up multiple possibilities for optimally configuring a microwave semiconductor module.

Figure 5:
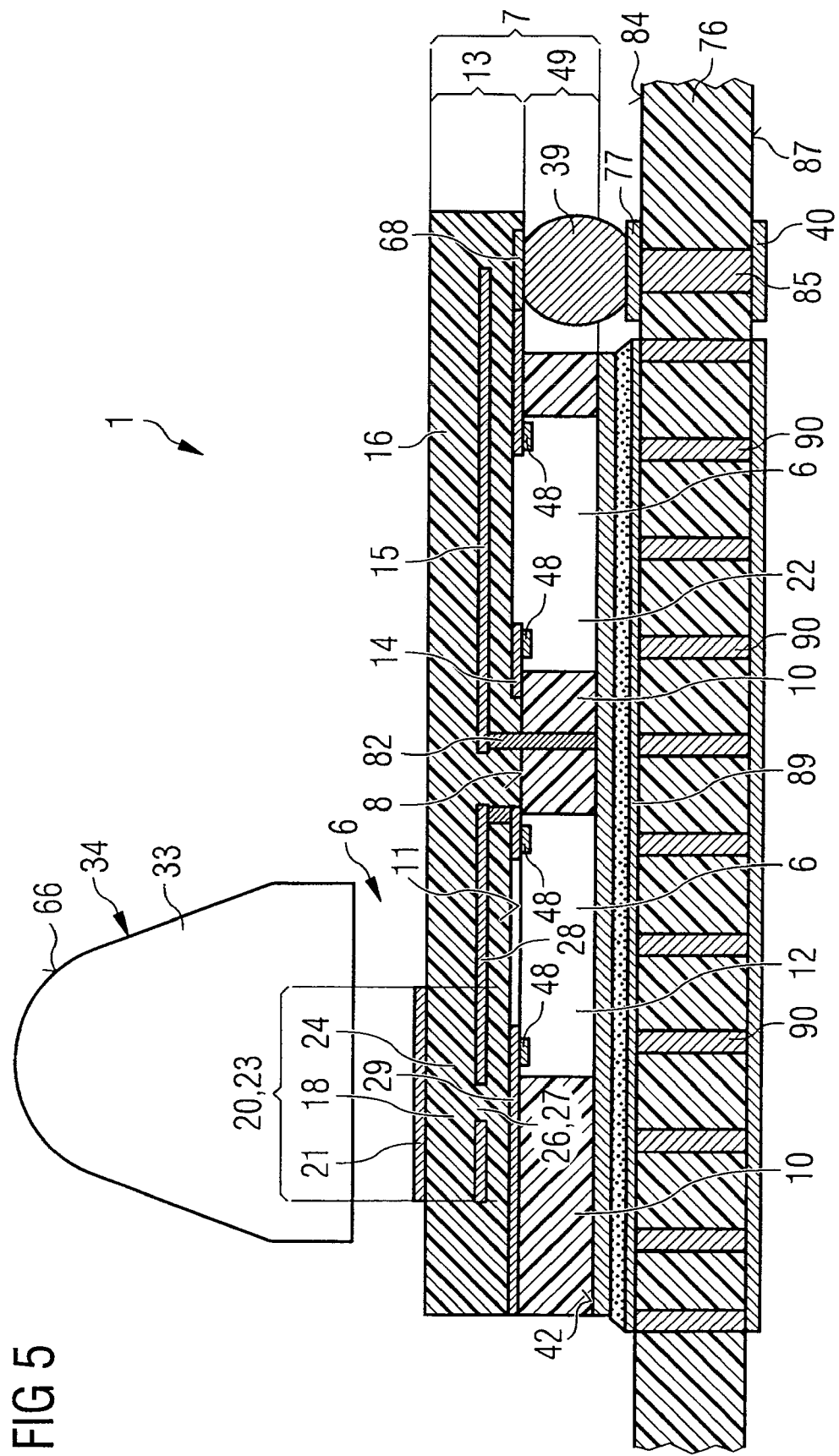
FIG. 5 is a schematic cross section through the semiconductor module according to FIG. 1 with a solder ball connecting element to a contact connecting surface of a superordinate printed circuit board.

FIG. 5 shows a schematic cross section through the semiconductor module 1 in accordance with FIG. 1 with a solder ball connecting element 39 from a contact connection surface 68 of the lower metal layer 14 on the principal surface 8 of the plastic casing 7 to a connecting contact surface 77 on the upper side 84 of a superordinate printed circuit board 76. Components having the same functions as in the preceding figures are characterized with the same reference numerals and are not explained additionally.

Figure 6:
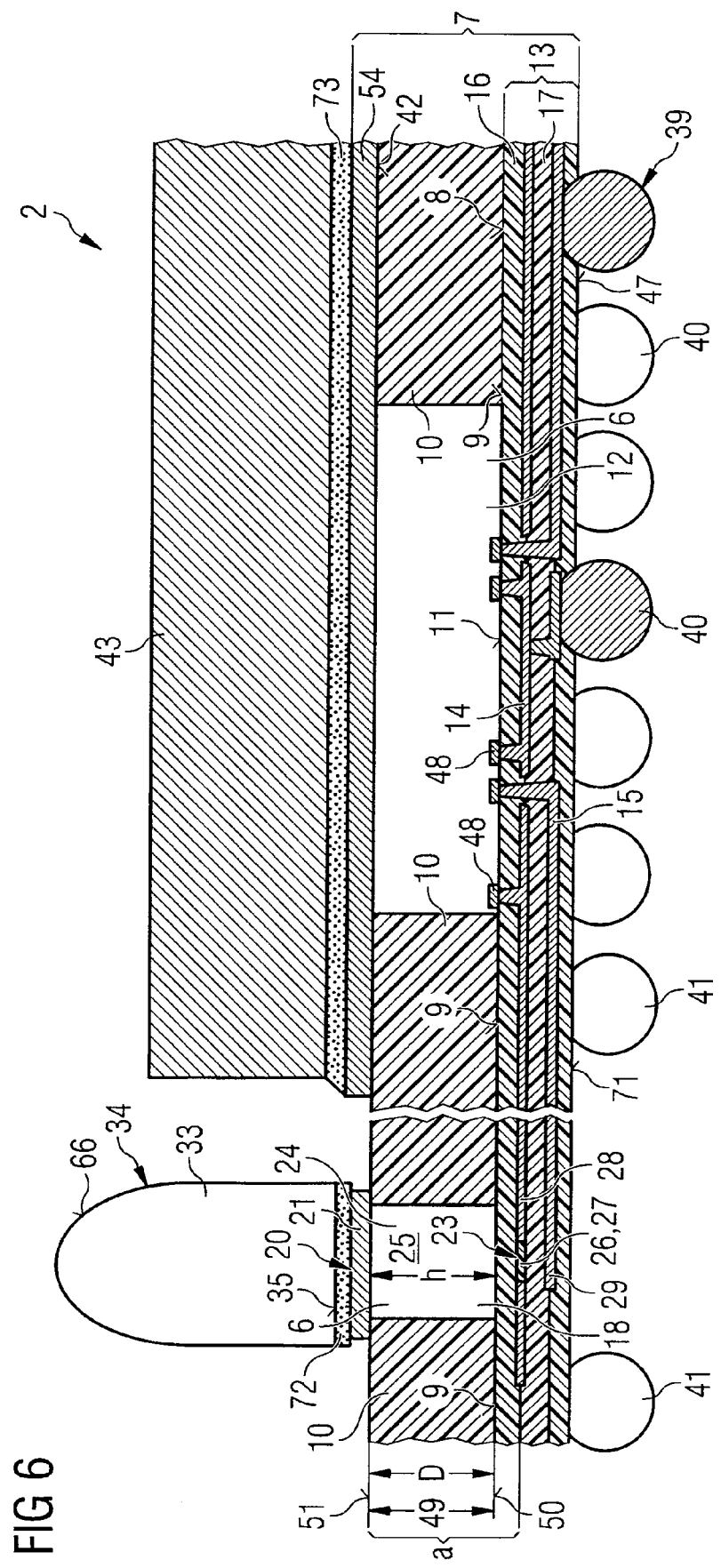
FIG. 6 is a schematic cross section through the semiconductor module of a second illustrative embodiment.

FIG. 6 shows a schematic cross section through a semiconductor module 2 of a second illustrative embodiment. This semiconductor module 2 is also based on a plastic casing 7 with a composite board 49 having a back side 51 and an upper side 50, a multilayered conductor track structure 13 being disposed on the upper side 50. For this purpose, the upper side 50 of the composite board 49 forms a principal surface 8 which is composed of the upper side 9, a plastic package molding compound 10, and active upper sides 11 of semiconductor chips 12.

Unlike the first illustrative embodiment according to FIG. 1, the antenna coupling region 24 is not disposed in an insulation material having a suitable relative dielectric constant but is formed by a coupling cavity 25 which is incorporated in the plastic package molding compound and has a relative dielectric constant of 1. Consequently, the coupling frequency for the antenna structure 34 is principally determined by the thickness D of the plastic package molding compound 10 for the composite board 49 of the plastic casing 7.

The coupling cavity 25 can be incorporated in the plastic package molding compound 10 from the back side 51 of the composite board 49 by laser ablation or, if the configuration of the coupling cavity 25 is more complex, it can be performed before completion of the composite board 49 by forming a sacrificial material structure in the plastic package molding compound 10. Suitable materials for this type of sacrificial material structure are described above. The removal of the sacrificial material structure has also already been discussed in detail. The possibility of filling the forming cavity 25 with a liquid for adjusting a suitable relative dielectric constant has also been discussed so that this will not be discussed again to avoid repetition.

Located in the area of the multilayered conductor track structure is a slotted antenna structure 23 by which the energy is coupled in from the semiconductor chip 12 to the antenna structure 34 via the cavity 25. Whereas the height h of the cavity is determined by the thickness D of the composite board 49, in this illustrative embodiment the spacing between a slotted electrode 28 with the aperture 26 and a radiation plate 21 is larger since an insulation layer 16 with a suitable relative dielectric constant $\in_r$ is disposed between the cavity 25 and the aperture 26. The radiation plate 21 terminates the coupling cavity on the back side 51 of the composite board 49. The directionality of the antenna is intensified by a dielectric lens 33 which is fixed on the radiation plate 21 with the aid of an adhesive 72. In this illustrative embodiment, the remaining back side surface of the plastic casing 7 is covered by a structured metal layer 54 on which a heat sink 43 is arranged by a heat-conducting layer 73 of filled adhesive and/or solder material.

At the same time, the upper side 71 of the multilayered conductor track structure 13 forms the back side 47 of the semiconductor module 2 and is loaded with external contacts 40, which are solder balls 39 for example, of which some solder balls serve as mechanical supports 41, especially in the vicinity of the antenna structure 34 and other solder balls 39 are electrically connected as external contacts 40 to a metal layer 14 and/or 15. Through this arrangement of the external contacts 40 and the mechanical supports 41 in the form of solder balls, it is possible to fix the entire semiconductor module 2 on an upper side of a superordinate printed circuit board using a single soldering process.

Figure 7:
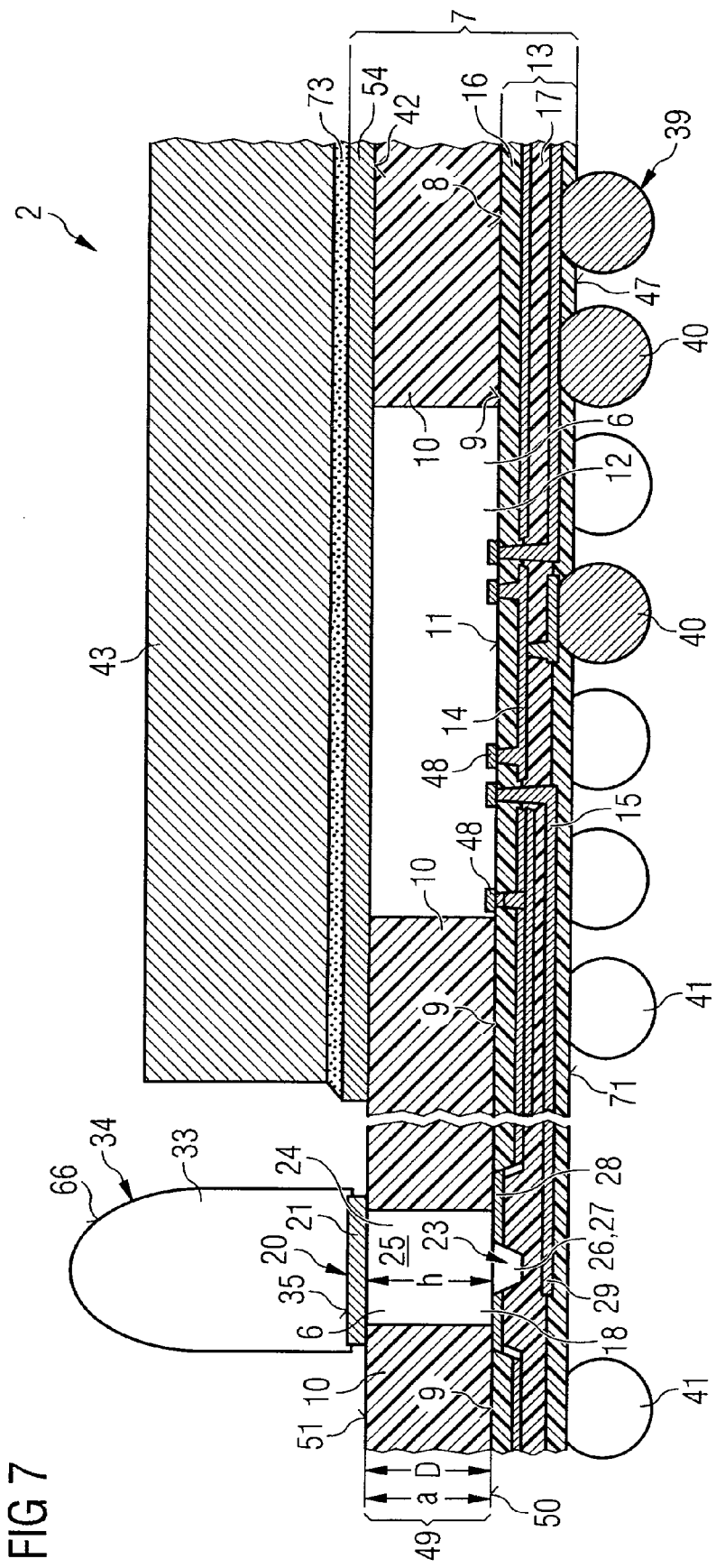
FIG. 7 is a schematic cross section through the semiconductor module according to FIG. 6, with a first illustrative modification of the antenna structure.

FIG. 7 shows a schematic cross section through the semiconductor module 2 according to FIG. 6 with a first modification of the antenna structure 34. This modification involves arranging the slotted electrode 28 with aperture 26 directly on the upper side 50 of the composite board 49 or on the principal surface including plastic package molding compound 10 and semiconductor chip 12. Consequently, the spacing a between the radiation plate 21 covering the cavity 25 and the slotted electrode 28 corresponds to the thickness D of the plastic package molding compound 10 and at the same time also forms the height h of the coupling cavity 25. With otherwise the same structure of the plastic casing 7, as shown in FIG. 6, the output power may be optimized with this modification of the antenna structure 34 with antenna coupling region 24.

Figure 8:
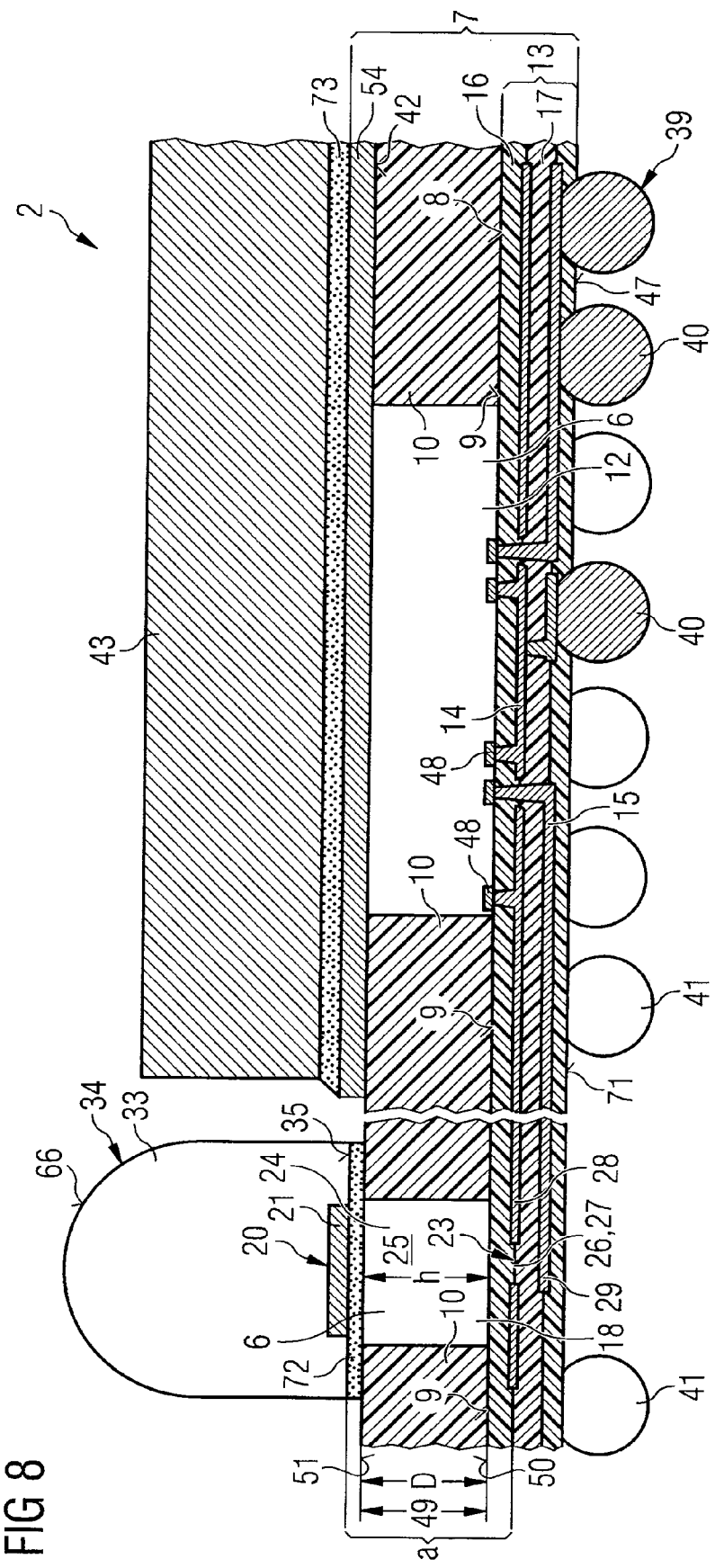
FIG. 8 is a schematic cross section through the semiconductor module according to FIG. 6, with a second illustrative modification of the antenna structure.

FIG. 8 shows a schematic cross section through a semiconductor module 2 according to FIG. 6 with a second modification of the antenna structure 34. Components having the same functions as in the preceding figures are characterized with the same reference numerals and are not explained additionally. In this illustrative embodiment, the radiation plate 21 is integrated in the base region of the dielectric lens 33 so that the base surface 35 and the radiation plate 21 form a principal surface. The base surface 35 of the dielectric lens is connected to the back side 51 of the composite body 49 by an adhesive layer 72 and terminates a coupling cavity 25 disposed in the plastic package molding compound 10.

Figure 9:
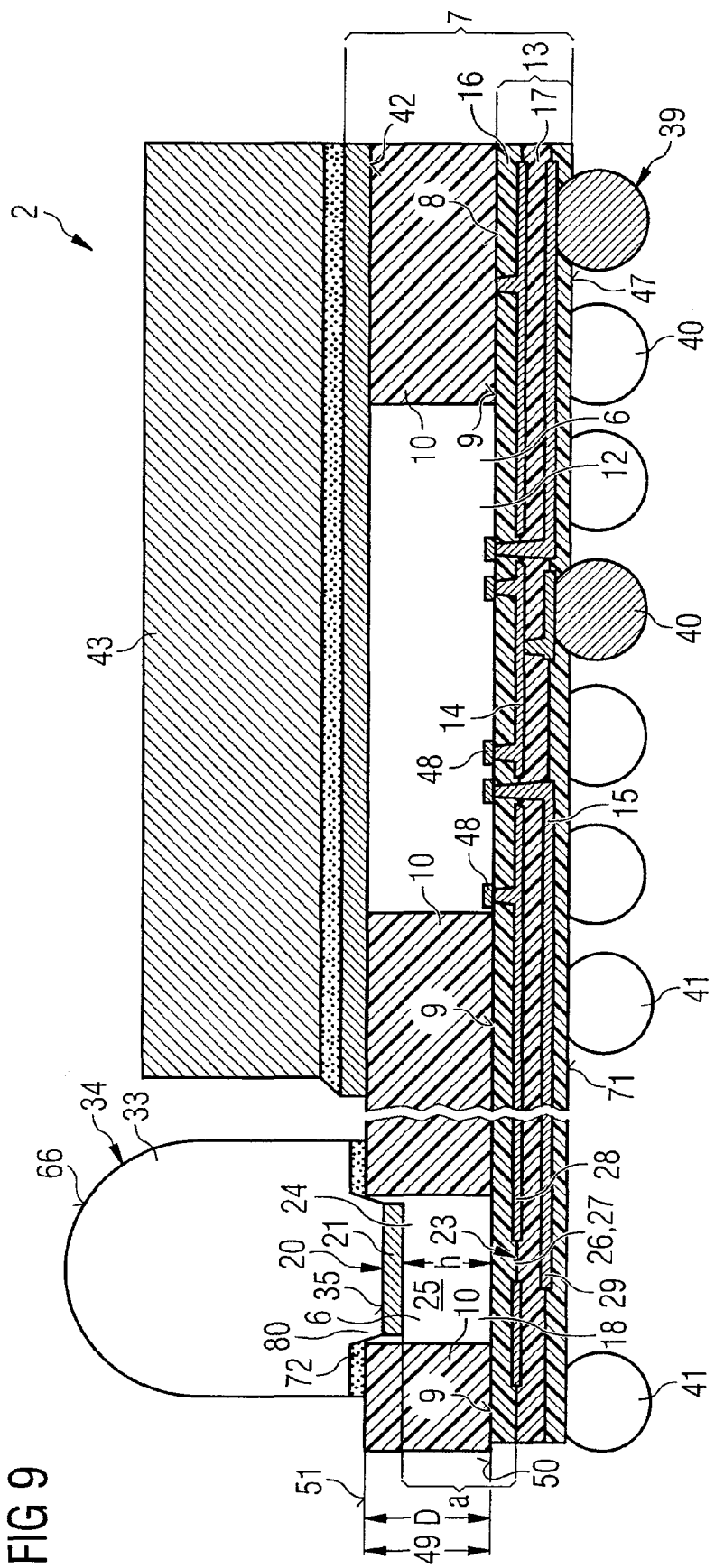
FIG. 9 is a schematic cross section through the semiconductor module according to FIG. 6, with a third illustrative modification of the antenna structure.

FIG. 9 shows a schematic cross section through the semiconductor module 2 according to FIG. 6 with a third modification of the antenna structure 34. In this case also, components having the same functions as in the preceding figures are characterized with the same reference numerals and are not explained additionally. In this illustrative embodiment, the dielectric lens 33 has a pedestal 80 in the base region on which the radiation plate 21 is fixed and which projects into the cavity 25 so that even higher frequencies can be coupled via the antenna coupling region 24 and the height h of the coupling cavity 25 can be configured independently of the thickness D of the composite board 49.

Figure 10:
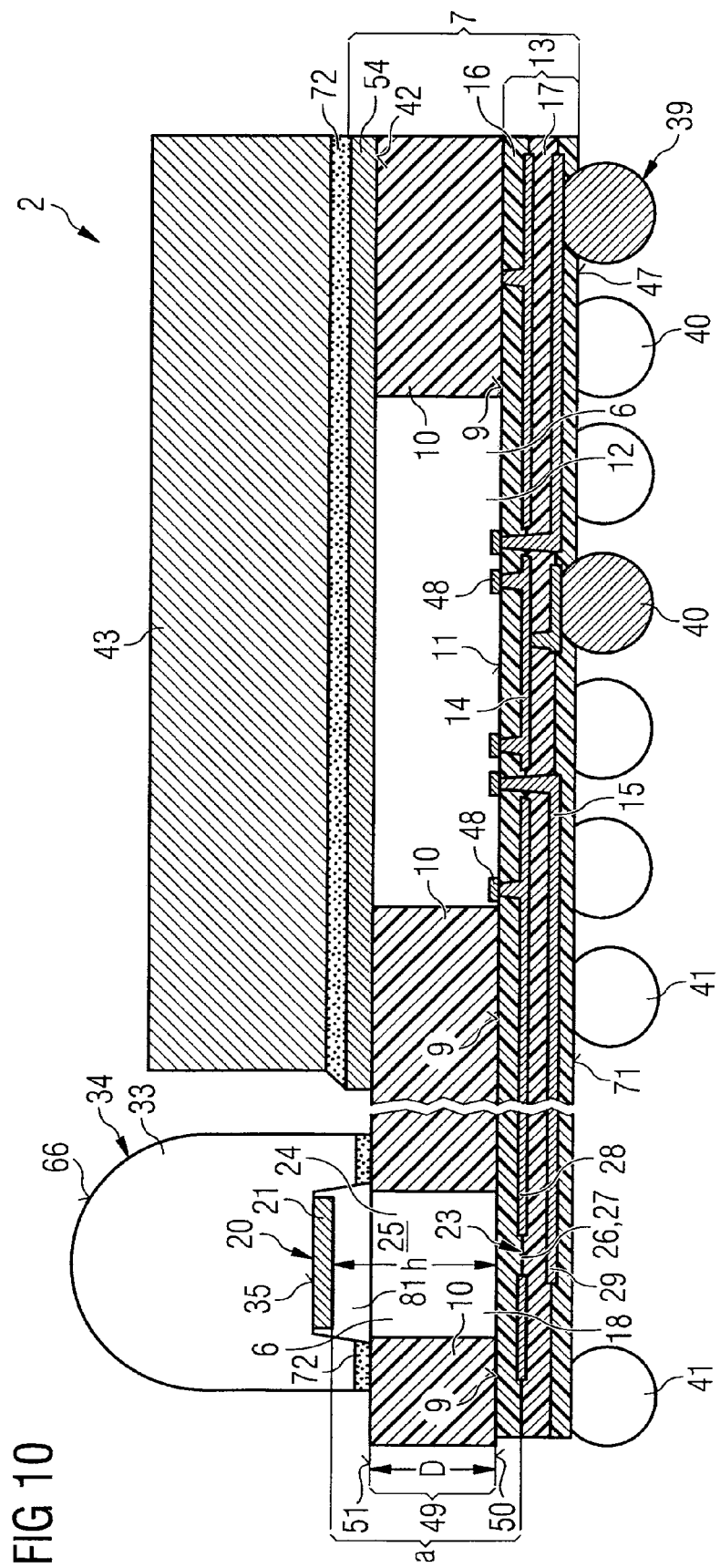
FIG. 10 is a schematic cross section through the semiconductor module according to FIG. 6, with a fourth illustrative modification of the antenna structure.

FIG. 10 shows a schematic cross section through the semiconductor module 2 according to FIG. 6 with a fourth modification of the antenna structure 34. In this case, the dielectric lens 33 has an indentation 81 in the area of the base surface 35 of the lens 33 which bears the radiation plate 21. Consequently, the spacing a between the slotted electrode 28 and the radiation plate 21 is further enlarged so that lower frequencies can be transmitted with this coupling cavity 25 without the composite board needing to be unnecessarily thick.

Figure 11:
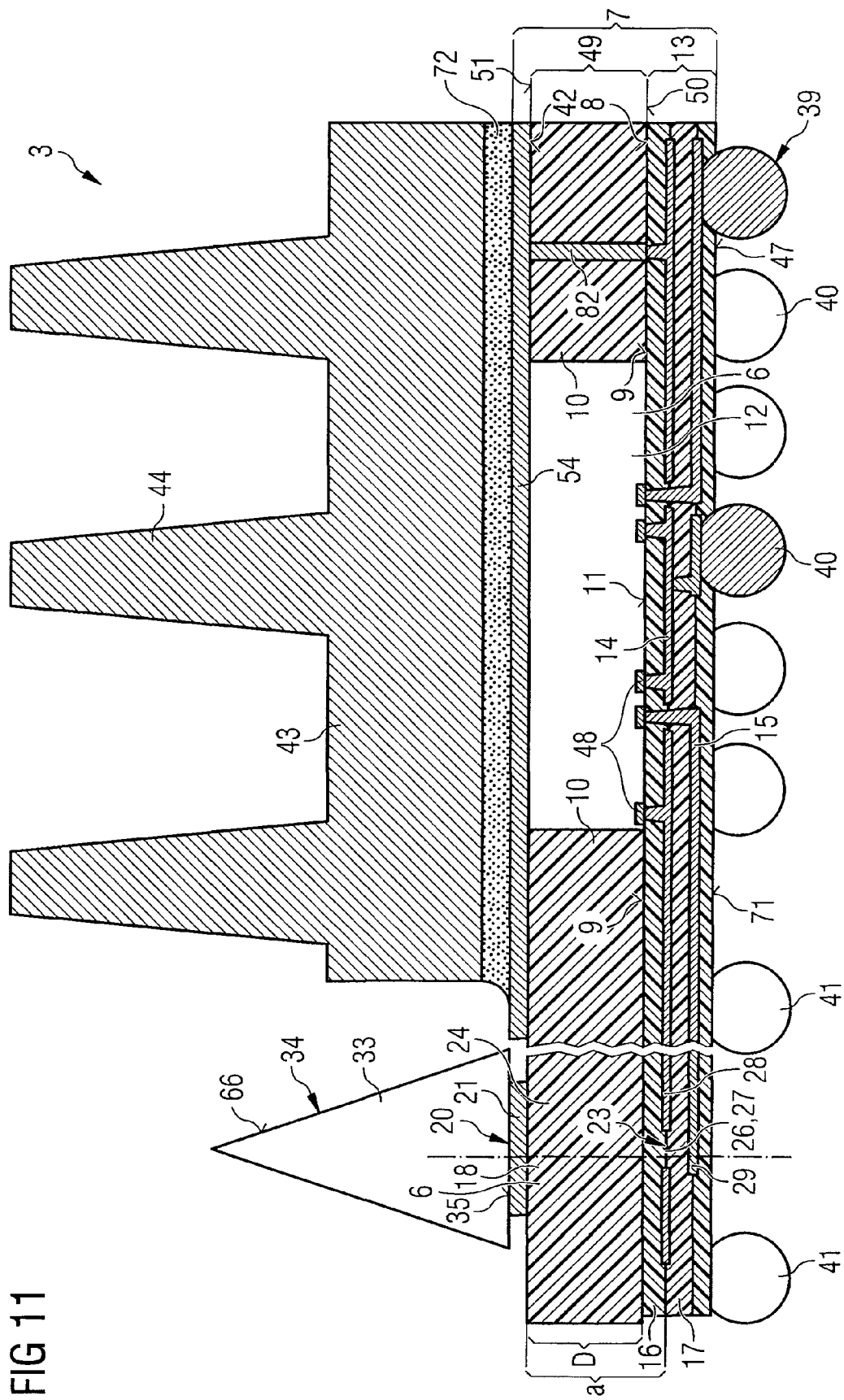
FIG. 11 is a schematic cross section through a semiconductor module of a third illustrative embodiment.

FIG. 11 shows a schematic cross section through a semiconductor module 3 of a third illustrative embodiment. Components having the same functions as in the preceding figures are characterized with the same reference numerals and are not explained additionally.

This third illustrative embodiment differs from the second illustrative embodiment in that cooling fins 44 are disposed on the heat sink 43 and that the microwave insulation region 18 is formed below the radiation plate 21 by plastic package molding compound 10. However, at least in the area of the antenna structure 34, this plastic package molding compound 10 has a relative dielectric constant $\in_r$ between $1 \leq \in_r \leq 3.5$, without forming a cavity. Plastic foams can be used for this purpose, which replace the plastic package molding compound 10 in this antenna structure 34, at least in the antenna coupling region and have a suitable relative dielectric constant $\in_r$.

FIG. 11 also shows a contact via 82 from the metal layer 14 on the upper side 50 of the composite board to the metal layer 54 on its edge side 51. EMC shielding can be achieved hereby. Furthermore, similar external contacts as shown in FIGS. 2, 3, 4, and/or 5 can be formed by these contact vias and structuring of the metal layer 54 outside the antenna coupling region.

Figure 12:
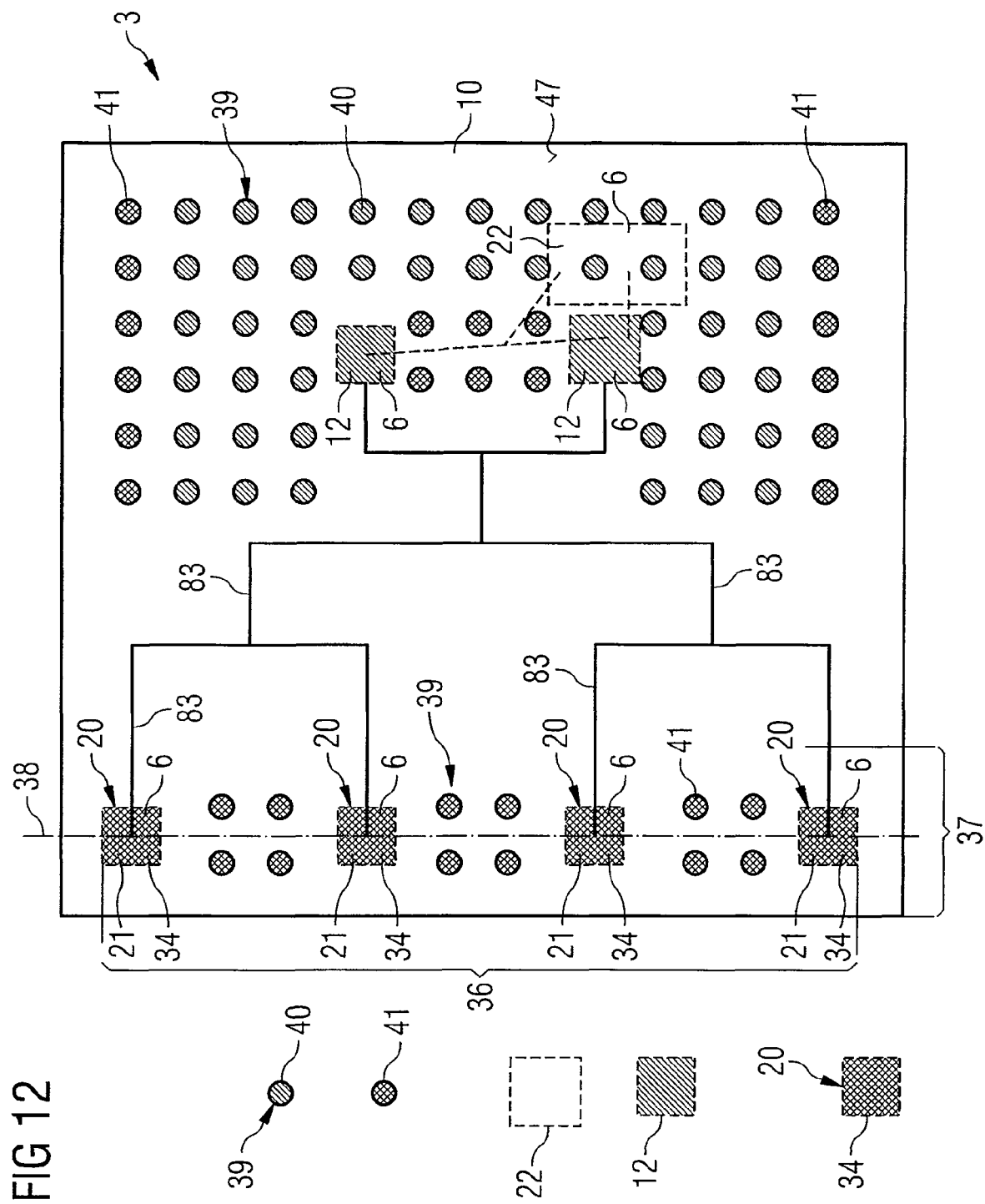
FIG. 12 is a schematic view of the semiconductor module from below, according to FIGS. 6 to 11.

FIG. 12 shows a schematic view of the semiconductor module 3 from below, according to one of the illustrative embodiments. In this case, the outlines of the high-frequency components 6, such as the semiconductor chips 12 and 22, for example and the antenna structures 34 are characterized by dashed lines, especially as these are partially embedded in the plastic package molding compound 10 and/or like the radiation plates 21 on the upper side of the semiconductor module 3 not shown here, which are arranged opposite to the back side 47 of the semiconductor modules 1 to 6 shown here.

In this view of the illustrative embodiments from below, four patch antennas 20 with their radiation plates 21 are arranged in a line 38 in an edge zone 37 of the semiconductor module 3 in an antenna array. The edge zone 37 has solder balls 39 which serve as mechanical supports 41 whereas the region in which the semiconductor chips 12 and 22 are embedded also has solder balls 39 which form electrical external contacts 40 of the semiconductor module 3. The ordered arrangement of these patch antennas 20, e.g. in a line 38, as shown here, intensifies the directionality of the antennas, whereby such an arrangement of patch antennas is used for distance radar equipment and for directional recognition in vehicles. Such an "ordered arrangement" can also be appropriate on curves to achieve improved directional and/or positional resolution by dynamic viewing of the signal profiles of the individual patch antenna signals.

The signal leads 83 from and/or to the semiconductor amplifiers such as VCO, from and/or to the individual patch antennas can easily be designed according to the criteria of coplanar waveguides or striplines. Matched signal splitting and/or signal combining can be achieved by the optionally applied thin-film technology of the conductor track structure 13. As a result of the short and exact lead structures 13, phase angles of the transmitted signal and/or received signal or phase angles of the individual patch antenna signals can be detected particularly accurately. All time-critical signals in the GHz range can be evaluated and processed immediately in a DSP (22) and passed on in largely delay-uncritical signals, which can be in digital form, via lead structures 13 and external contacts 40 to a superordinate printed circuit board for further processing.

Figure 13:
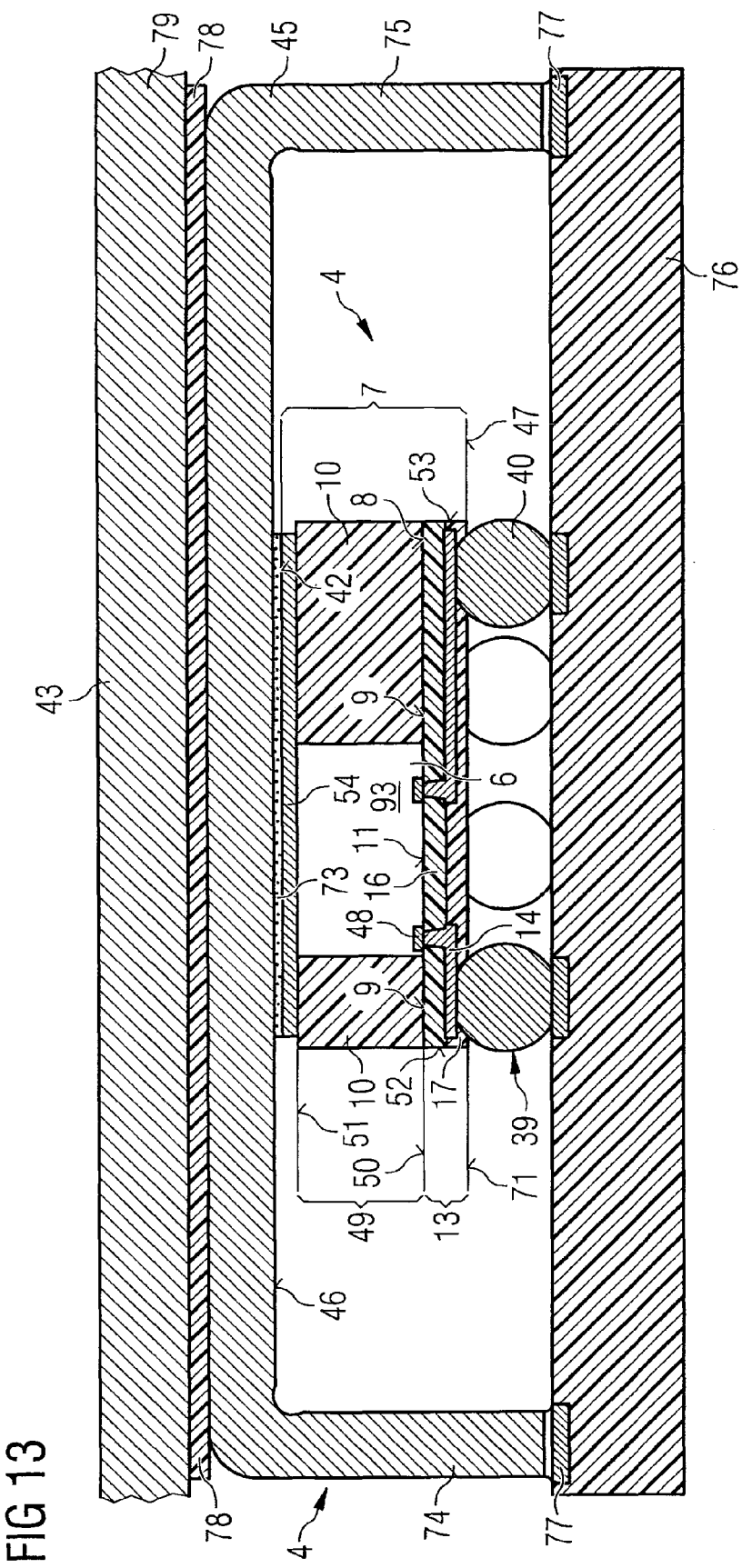
FIG. 13 is a schematic cross section through a semiconductor module of a fourth illustrative embodiment.

FIG. 13 shows a schematic cross section through a semiconductor module 4 of a fourth illustrative embodiment of the invention. The semiconductor module 4 includes a semiconductor chip 93 which is a current switching device and can be used in power management applications for example. The module 4 is not designed for microwave engineering applications and does not include an antenna.

This semiconductor module 4 is also constructed on the basis of a plastic casing 7, where the back side 51 of the composite board 49 is connected via a metal layer 54 and a thermally conducting layer 73 to the inner side 46 of a screening case 45 which projects over the edge sides 52 and 53 of the plastic casing and forms side walls 74 and 75, which partially enclose an interior space which can receive the semiconductor module.

The sides 74 and 75 on a superordinate circuit board 76 of a customer are at the same time soldered to the external contacts 40 of the semiconductor module 4 on corresponding contact connecting surfaces 77.

A customer-specific heat sink 43 or a corresponding heat-conducting customer casing 79 can be fixed on the screening case 45 by a heat-conducting coupling layer 78. The specific thermal loads are reduced and the heat-transmitting surfaces are enlarged by the first thermal spreading in the thermally good-conducting metal layer 54 and/or by the second thermal spreading in the screening case 45 so that relatively low demands with regard to heat conduction are imposed on the connections 73 and even lower demands on the connection 78.

Figure 14:
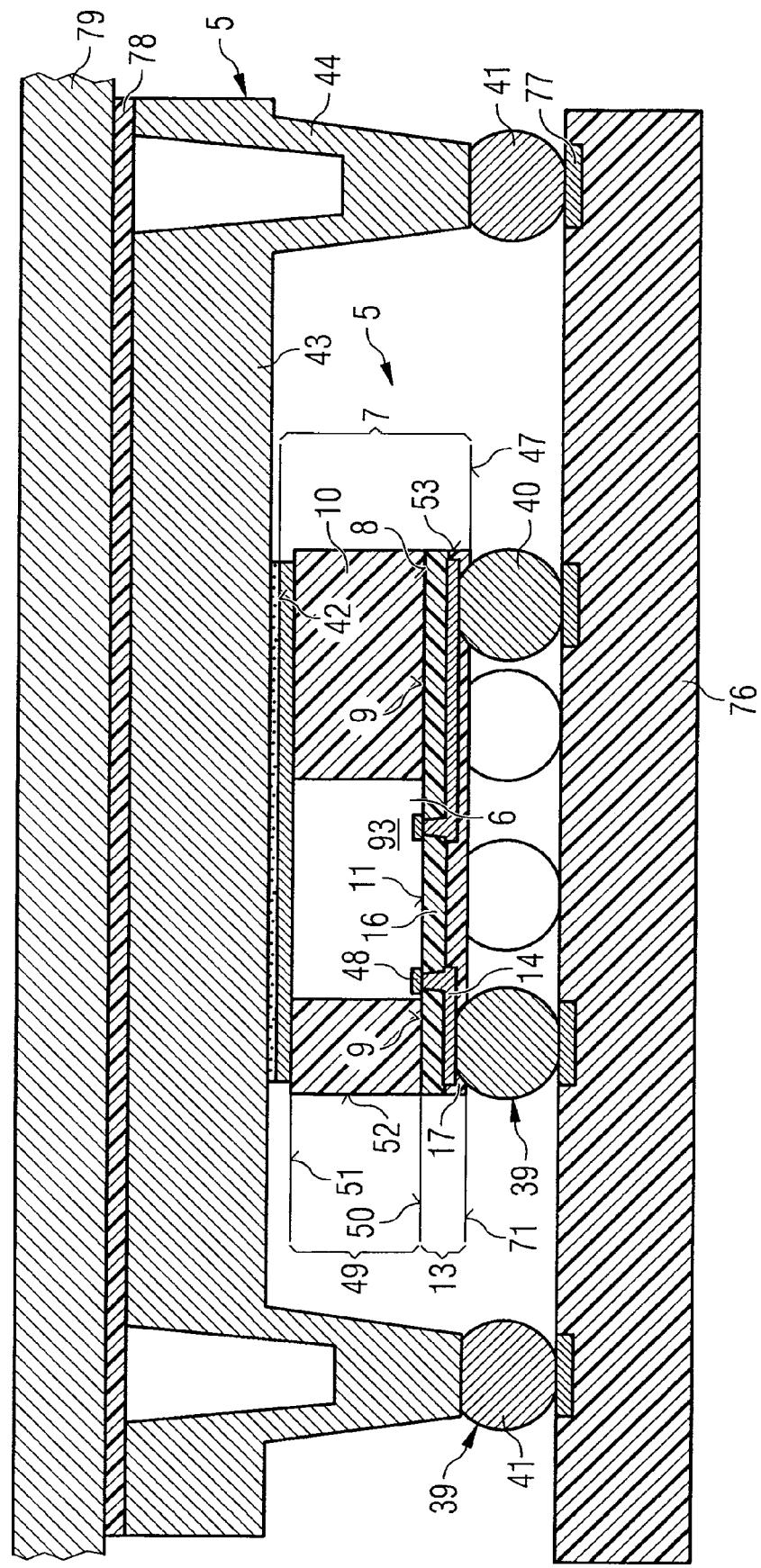
FIG. 14 is a schematic cross section through a semiconductor module of a fifth illustrative embodiment.

FIG. 14 shows a schematic cross section through a semiconductor module 5 of a fifth illustrative embodiment also including a semiconductor chip 93 as a current switch. Components having the same functions as in the preceding figures are characterized with the same reference numerals and are not explained additionally.

In this illustrative embodiment, the plastic casing 7 is fixed on a heat sink 43 with the back side 51 of the composite board 49 whereby cooling fins 44 are arranged adjacent to the edge sides 52 and 53 of the plastic casing 7 and bear solder balls 39 as mechanical supports 41. These solder balls 39 are used to fix the cooling fins 44 on connecting contact surfaces 77 on a customer-specific superordinate printed circuit board 76. In an illustrative embodiment not shown, the mechanical supports 41 can be implemented by adhesion or crimping. This additionally allows mounting of the heat sink after soldering of the semiconductor module onto the superordinate printed circuit board 76.

The semiconductor module 5 based on a plastic casing 7 is disposed between the cooling fins 44. In this illustrative embodiment, in addition to the heat sink 43, it is also possible for a heat-conducting customer casing 79 to be arranged on the heat sink 43 by a heat-conducting coupling layer 78.

Figure 15:
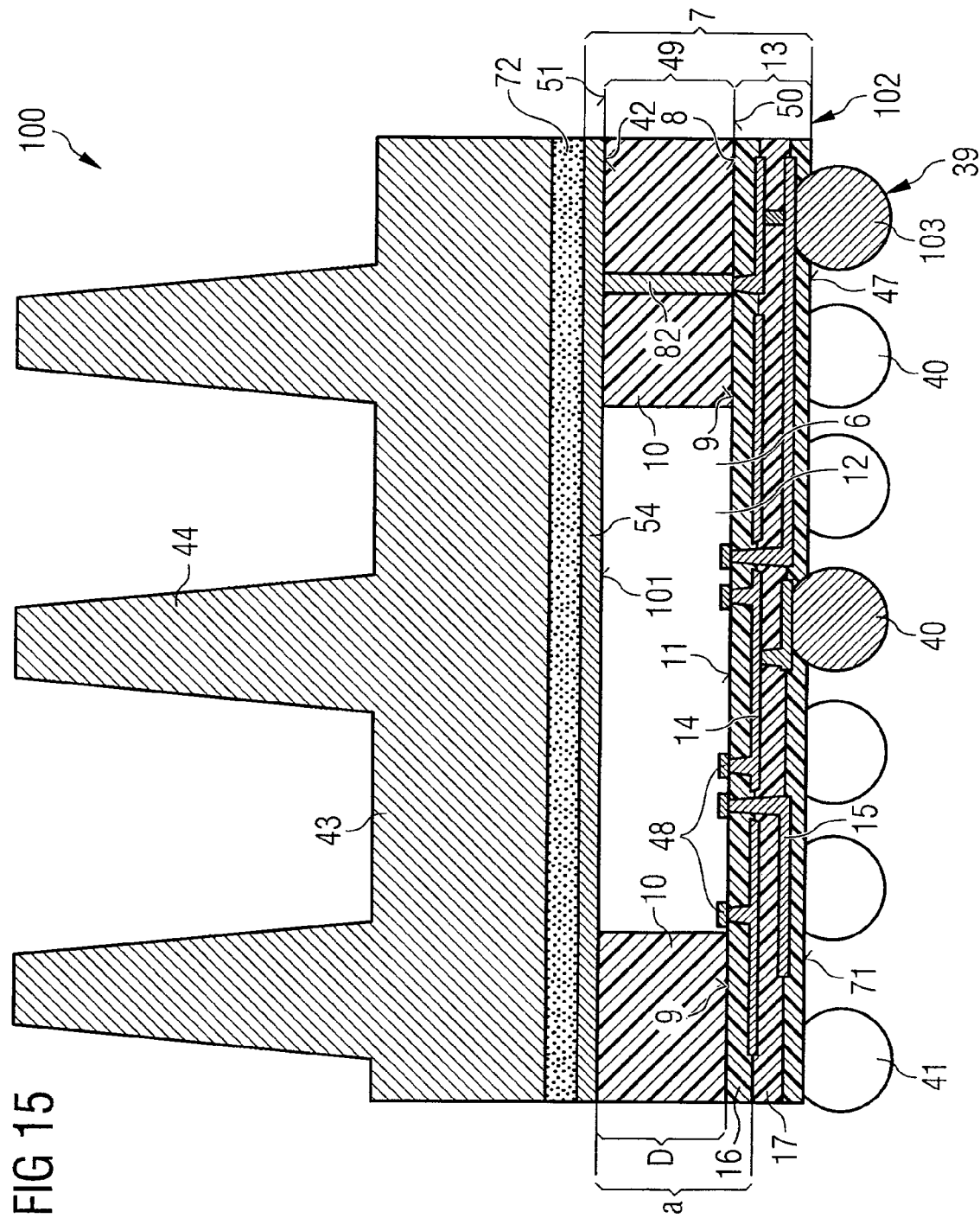
FIG. 15 illustrates a semiconductor module of a sixth illustrative embodiment.

FIG. 15 illustrates a schematic cross section through a semiconductor module 100 of a sixth illustrative embodiment. Components having the same functions as in the preceding figures are characterized with the same reference numerals and are not explained additionally.

The semiconductor module 100 includes a semiconductor chip 12 and electromagnetic screening which is provided by the second metal layer 54 disposed on the second principal surface 42 of the plastic casing 7 of the semiconductor module 100, through contact 82, metal layers 14 and 15 positioned on the first principal surface 8 of plastic casing 7 and external contact 103. The external contact 103 may be connected to the ground plane of a superordinate or higher-level circuit board on which the semiconductor module 100 is mounted.

In the sixth illustrative embodiment, the first principal surface 8 includes an upper side 9 of a plastic package molding compound 10 and the active side 11 of the semiconductor chip 12. The active side 11 of the semiconductor chip 12 and the upper side 9 of the plastic package molding compound 10 are generally coplanar. The second principal side 42 includes a back side 51 of the plastic package molding compound 10 and the back side 101 of the semiconductor chip 12. This arrangement of an exposed back side 101 of the semiconductor chip 12 reduces the thermal path between the semiconductor chip 12 and the heat sink 43 positioned on the second principal surface 42 of the semiconductor module 100.

In further illustrative embodiments not shown in the figures, the back side 101 of the semiconductor chip 12 is embedded within the plastic package molding compound 10. In these illustrative embodiments, the second principal surface 42 of the plastic casing 7 includes only plastic package molding compound 10. The plastic package molding compound may electrically isolate the back side 101 of the semiconductor chip from the second metal layer 54.

The second metal layer 54 disposed on the second principal surface 42 extends over the whole of the second principal surface 42 of the semiconductor module 100.

The semiconductor module 100 also includes at least one through contact 82 which extends from the second principal surface 42 to the first principal surface 8 and which is embedded within the plastic package molding compound 10. The through contact 82 is in electrical contact with the second metal layer 54 and with the structured first metal layers 14, 15 positioned on the opposing first principal surface 8 as well as external contact 103. The second metal layer 54 may be connected to ground via the through contact 82 and the multilevel conductor track structure 13 positioned on the first principal surface 8. This arrangement provides the semiconductor module 100 with electromagnetic screening.

Through contacts 82 may be provided which are arranged at intervals around the side faces of the semiconductor chip. Each through contact 82 may be connected to ground so that the through contacts 82 and the second metal layer 54 provide a Faraday cage type arrangement.

The semiconductor module 100 also includes a heat sink 43 with cooling fins 44 which is attached to the second metal layer 54 by a layer of electrically non-conductive adhesive 72. The heat sink 43 is electrically isolated from the second metal layer 54 and the electromagnetic shielding structure 102 in the sixth illustrative embodiment.

The semiconductor 100 may be used to accommodate a semiconductor chip 12 which should be protected from external electromagnetic radiation. Alternatively, the semiconductor chip 12 may itself emit electromagnetic radiation whose emission range should be limited by the use of a module including an electromagnetic shielding structure.

While the invention has been described in detail and with reference to specific illustrative embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What we claim is:

1. A semiconductor module including components in a plastic casing, wherein said semiconductor module comprises:
    a plastic package molding compound;
    a semiconductor chip embedded in the plastic package molding compound;
    a first principal surface including an upper side of the plastic package molding compound and at least one active upper side of the semiconductor chip;
    a second principal surface including a back side of the plastic package molding compound;
    a multilayered conductor track structure disposed directly on the first principal surface, including structured insulation layers and structured first metal layers arranged in an alternating fashion; and
    a second metal layer disposed on the second principal surface.

2. The semiconductor module according to claim 1, wherein the semiconductor chip includes a voltage controlled oscillator (VCO).

3. The semiconductor module according to claim 1, wherein the semiconductor chip includes a digital signal processor semiconductor chip (DSP).

4. The semiconductor module according to claim 1, wherein the semiconductor chip includes a digital signal processor semiconductor chip (DSP) and further includes active and/or passive components embedded in the plastic package molding compound.

5. The semiconductor module according to claim 1, further including surface-mountable solder balls which are provided as external contacts on a circuit board and as mechanical supports and/or spacers of the semiconductor module.

6. The semiconductor module according to claim 1, further including at least one through contact extending from the second metal layer on the second principal surface to the structured metal layers disposed on said first principal surface.

7. The semiconductor module according to claim 1, wherein the second principal surface includes a rear side of the semiconductor chip and the plastic package molding compound.

8. The semiconductor module according to claim 1, wherein the multilayered conductor track structure is positioned on both the active upper side of the semiconductor chip and the plastic molding compound of the first principal surface, and the second metal layer is disposed on the back side of the semiconductor chip and the plastic package molding compound of the second principal surface.

9. A semiconductor module having components in a plastic casing, the semiconductor module comprising:
    a plastic package molding compound;
    a semiconductor chip;
    a first principal surface including an upper side of the plastic package molding compound and at least one active upper side of the semiconductor chip;
    a second principal surface including a back side of the plastic package molding compound;
    a multilayered conductor track structure disposed directly on the first principal surface; and
    a heat sink disposed on the second principal surface.

10. The semiconductor module according to claim 9, wherein the heat sink includes cooling fins between which the plastic package molding compound is disposed.

11. The semiconductor module according to claim 9, wherein the heat sink is a screening case and the plastic package molding compound is disposed on an inner side of the screening case.

12. The semiconductor module according to claim 9 further including a second metal layer disposed directly on the second principal surface.

13. The semiconductor module according to claim 12, wherein the second metal layer is electrically isolated from the heat sink.

14. The semiconductor module according to claim 12, wherein the second metal layer is electrically conductively connected to the multilayer conductor track by a through contact extending from the second principal surface to the first principal surface.

15. The semiconductor module according to claim 10 further including external contacts, wherein the cooling fins of the heat sink include solder balls and form a plane with the external contacts in which the external contacts and the solder balls of the heat sink are surface-mountable.

16. The semiconductor module according to claim 9, wherein the second principal surface includes a rear side of the semiconductor chip and the plastic package molding compound.

17. The semiconductor module according to claim 12, wherein the multilayered conductor track structure is positioned on both the active upper side of the semiconductor chip and the plastic molding compound of the first principal surface, and the second metal layer is disposed on the back side of the semiconductor chip and the plastic package molding compound of the second principal surface.

* * * * *